(12) United States Patent
Cole et al.

(10) Patent No.: US 6,585,866 B2
(45) Date of Patent: *Jul. 1, 2003

(54) HIGH PURITY COBALT SPUTTER TARGET AND PROCESS OF MANUFACTURING THE SAME

(75) Inventors: Robert S. Cole, Cranberry Township, PA (US); Mathew S. Cooper, Portersville, PA (US); Stephen P. Turner, Moon Township, PA (US); Yinshi Liu, San Mateo, CA (US); Michael McCarty, Mars, PA (US); Rodney L. Scagline, Evans City, PA (US)

(73) Assignee: Honeywell International Inc., Morristown, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 10/104,582

(22) Filed: Mar. 21, 2002

(65) Prior Publication Data

US 2002/0148724 A1 Oct. 17, 2002

Related U.S. Application Data

(63) Continuation of application No. 09/139,240, filed on Aug. 25, 1998, now Pat. No. 6,391,172.
(60) Provisional application No. 60/057,349, filed on Aug. 26, 1997.

(51) Int. Cl.[7] ............................ C22C 19/07; C23C 14/00
(52) U.S. Cl. .................. 204/198.13; 420/435; 148/313; 148/425; 148/674
(58) Field of Search .................... 204/298.13; 420/435; 148/313, 425, 674

(56) References Cited

U.S. PATENT DOCUMENTS 3,091,022 A    5/1963   Faulkner (List continued on next page.)

FOREIGN PATENT DOCUMENTS

EP    0252478 A2    1/1988
EP    0 346 599 A1   12/1989

(List continued on next page.)

OTHER PUBLICATIONS

U. Admon et al., *Microstructure of electro–deposited cobalt– tungsten thin films*, 1986.
S. Vitkova et al., *Texture correspondence between the crystallites of H.C.P. and F.C.C. . . .*, 1975.
T. Wakiyama, *Magnetic and crystalline properties of hexagonal cobalt–iron alloys*, 1979.

Primary Examiner—Roy King
Assistant Examiner—Harry D. Wilkins
(74) Attorney, Agent, or Firm—Wells St. John P.S.

(57) ABSTRACT

A high purity cobalt sputter target is disclosed which contains a face centered cubic (fcc) phase and a hexagonal close packed (hcp) phase, wherein the value of the ratio of X-ray diffraction peak intensity, $I_{fcc}(200)/I_{hcp}(10\ 1)$, is smaller than the value of the same ratio in a high purity cobalt material obtained by cooling fcc cobalt to room temperature from the high temperature at which it is molten. High purity cobalt is defined as having an oxygen content of not more than 500 ppm, a Ni content of not more than 200 ppm, contents of Fe, Al and Cr of not more than 50 ppm each, and Na and K of less than 0.5 ppm. The disclosed sputter target is manufactured by subjecting the material to cold-working treatments (less than 4221C). Annealing the material, at a temperature in the range 300–4221C for several hours, between cold working treatments significantly increases the amount of cold work which could be imparted into the material. The high purity cobalt is deformed in such a way so as to cause the (0002) hcp plane to be tilted between 10–351 from the target normal. The aforementioned phase proportions and crystallographic texture significantly improves the sputtering efficiency and material utilization.

10 Claims, 4 Drawing Sheets

(1 of 4 Drawing Sheet(s) Filed in Color)

U.S. PATENT DOCUMENTS

| | | |
|---|---|---|
| 4,832,810 A | 5/1989 | Nakamura et al. |
| 5,112,468 A | 5/1992 | Weigert et al. |
| 5,282,946 A | 2/1994 | Kinoshita et al. |
| 5,412,967 A | 5/1995 | Ishihara |
| 5,667,665 A | 9/1997 | Shindo et al. |
| 5,810,983 A | 9/1998 | Shindo et al. |
| 6,176,944 B1 | 1/2001 | Snowman et al. |

FOREIGN PATENT DOCUMENTS

| | | |
|---|---|---|
| EP | 0799905 A1 | 3/1997 |
| JP | 63060549 | 3/1988 |
| JP | 6-192874 | 7/1994 |
| JP | 6-192879 | 7/1994 |
| JP | 7-3486 | 6/1995 |
| JP | 8127890 | 5/1996 |
| JP | 8253888 | 10/1996 |
| JP | 9227967 | 9/1997 |
| JP | 09272970 A | 10/1997 |

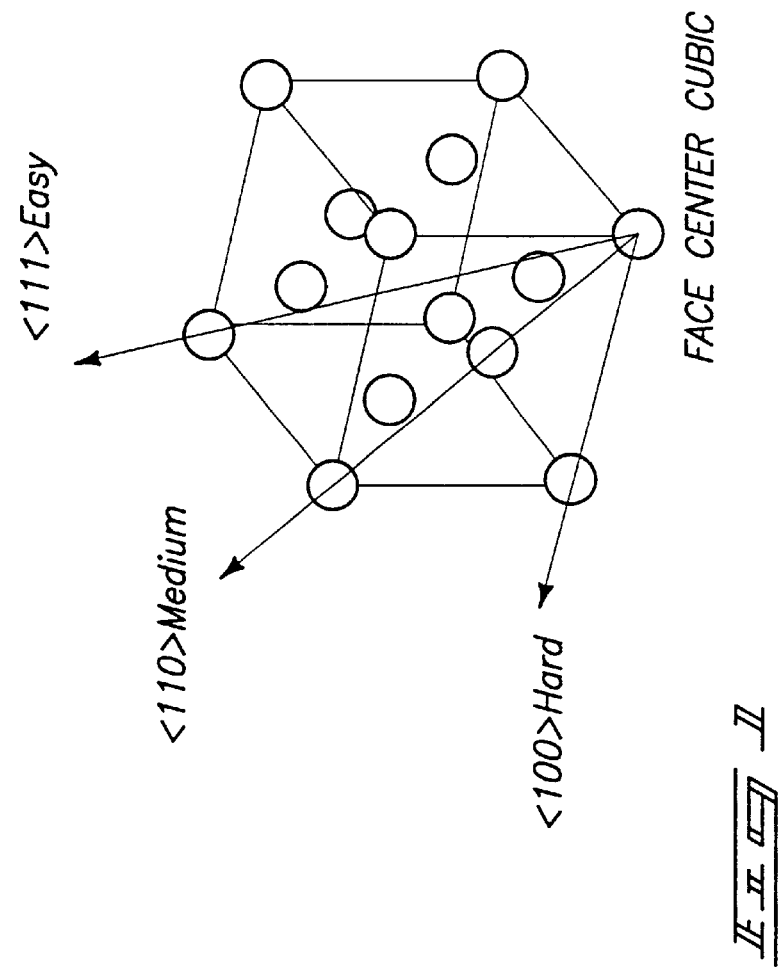
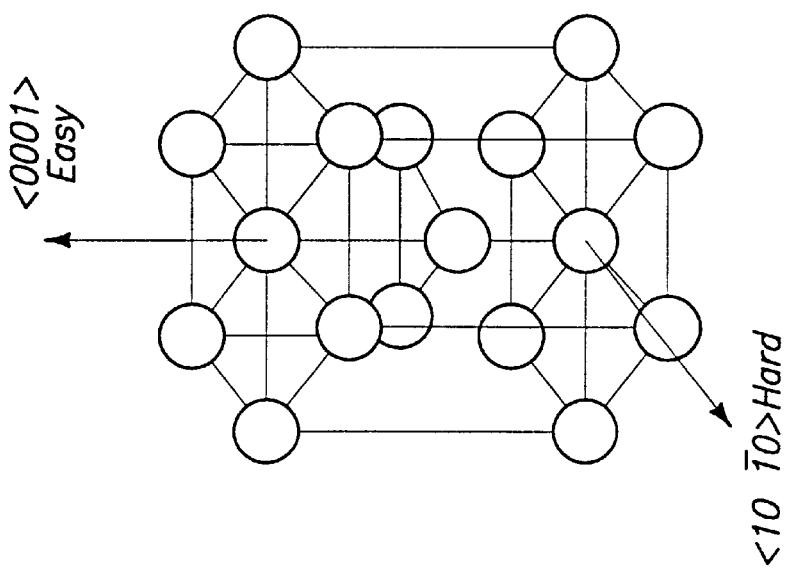
FIG. 1

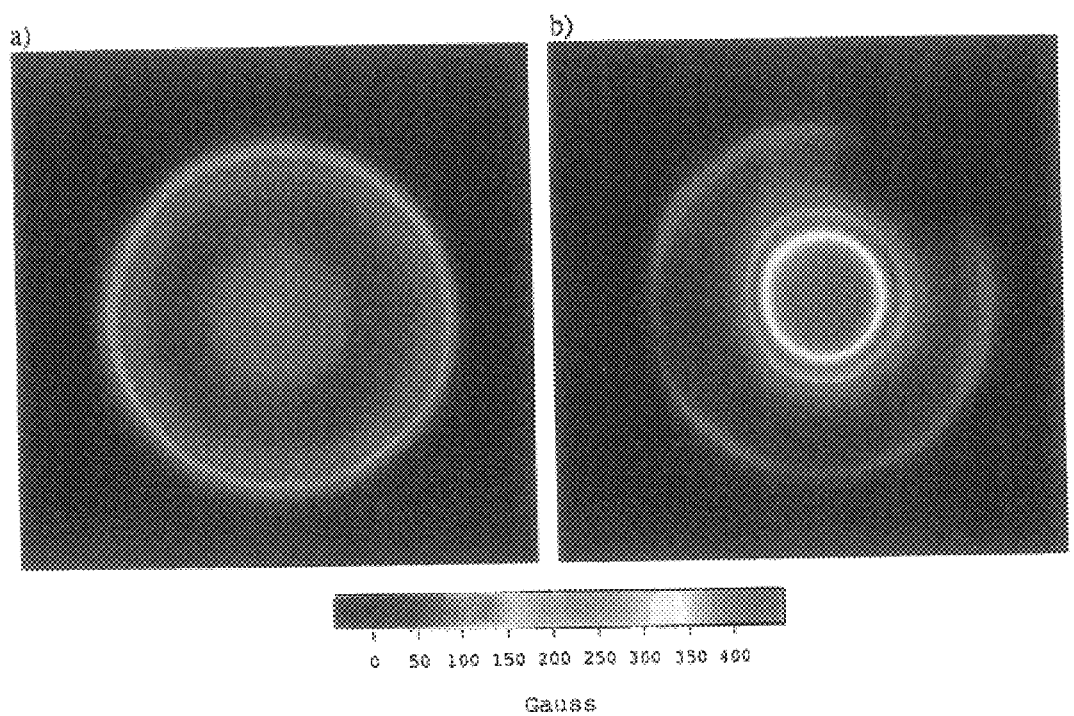

HIGH PURITY COBALT SPUTTER TARGET AND PROCESS OF MANUFACTURING THE SAME

This patent is a continuation application of U.S. patent application Ser. No. 09/139,240, which was filed on Aug. 25, 1998, now U.S. Pat. No. 6,391,172; and which claims priority to provisional application serial No. 60/057,359, which was filed Aug. 26, 1997.

FIELD OF INVENTION

The invention described herein relates to a method for manufacturing high purity cobalt for use in sputter targets and related microelectronics applications. High purity cobalt is defined as having an oxygen content of not more then 500 ppm, a Ni content not more than 200 ppm, an Fe, Al and Cr content not more than 50 ppm each, and Na and K not more than 0.5 ppm. The cobalt target exhibits a low magnetic permeability in the plane of the target and higher magnetic permeability normal to the target surface, i.e. large surface flux leakage. The invention is a method of fabrication of high purity cobalt with a grain structure which has a strong preferred crystallographic orientation in the hcp phase and little or no detectable fcc phase. This strong hcp crystallographic texture, (tilted (0002) plane), is critical to the sputtering efficiency and material utilization of the target used in the stated application.

BACKGROUND OF THE INVENTION

High purity cobalt targets are used in sputtering applications to produce thin films on microelectronic devices such as microprocessors, DRAM's, etc. DC magnetron sputtering efficiency relies heavily on the ability of a magnetic field to trap electrons liberated from the target, and direct them back to the negatively charged target where they are repelled. These electrons spiral through the plasma gas (typically argon) in the sputtering chamber towards the target. This spiraling motion increases the frequency of collisions with argon atoms, which results in more argon atoms striking the target and ultimately higher deposition rates. The sputtering rate is increased (to some asymptotic limit) by increasing the strength of the component of the magnetic field parallel to the target surface. This in turn relies heavily on the ability of the magnetic field to penetrate the target material. Cobalt, which is ferromagnetic, is very anisotropic in its magnetic properties, and can often resist field penetration. Consequently, when a magnetic substance such as conventionally processed cobalt is used as a target, the magnetic flux tends to pass through the interior of the target and only a low flux can exit into the plasma discharge space. This problem requires the use of very thin cobalt targets which as a result have relatively short service lives. Furthermore, the local cross-sectional decrease of the target during the sputtering (erosion trench) brings about an increasing magnetic flux directly over the erosion trench. This causes a higher ionization probability of the sputtering gas to occur in the region and a higher sputtering rate to occur locally, with the consequence that the erosion trench becomes very narrow, resulting in poor material utilization. The effect is compounded with the use of thin targets because of the exponential relationship between magnetic field strength and the distance from the magnet. A small amount of erosion on a thin target produces a much greater localized magnetic flux strength increase than would an equivalent amount of erosion on a thicker target, due to the fact that the thicker target surface is further from the magnetron magnet.

To combat these problems, a low magnetic permeability value in the plane of the high purity cobalt target is needed so that the magnetic flux leakage normal to the target is increased. This will allow target thickness to be increased, thereby extending target life, and improving sputtering efficiency and performance.

Cobalt has two crystalline forms—face centered cubic (fcc) and hexagonal close packed (hcp). The hcp phase is the low temperature crystal structure and exists up to 422° C.; above this temperature it transforms into the fcc phase. A conventional high purity cobalt sputtering target hitherto used comprises a mixture of these two phases. This conventional target is manufactured by a process wherein high purity cobalt material is heated until it is melted, and then poured into a mold. At this temperature the material it is in the fcc single phase. The cast ingot is then allowed to cool immediately or after it has been subjected to hot-working treatment, so that part of the fcc single phase is transformed into a martensitic structure which includes a hcp phase. The conventional high purity cobalt thus manufactured has been used for magnetron sputtering.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

FIG. 1 is an illustration of the magnetization directions in hcp and fcc cobalt;

FIG. 4 is an illustration of Pass Through Flux (PTF) measurements taken on both a conventional cobalt target and a target produced according to this invention.

DETAILED DESCRIPTION OF THE INVENTION

Figure 2:
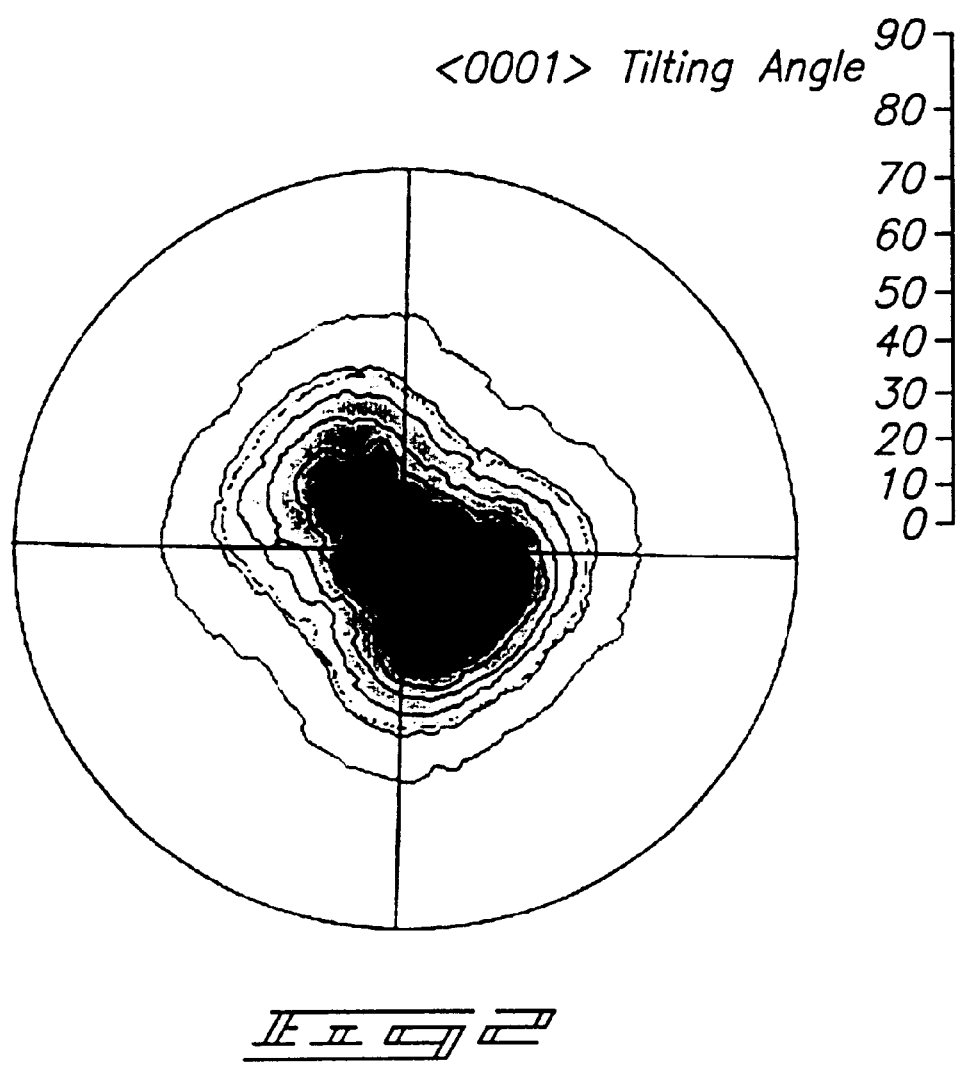
FIG. 2 is a graph of a (0002) pole figure showing 0–10° tilting of the <0001> hcp prism axis.

In the case of high purity cobalt, the ratio of fcc phase to hcp phase has significant influence on the magnitude of the magnetic permeability. The fcc phase is much less anisotropic in magnetic properties than the hcp phase. Consequently, a target consisting mostly fcc phase has very low PTF, and since there are no strongly preferred crystallographic directions the flux flow is dictated by the target geometry. This geometry tends to restrain the flux within the plane of the target and inhibits flux leakage. If the amount of hcp phase in the target is increased and the easy magnetization direction <0001> in the hcp crystal is aligned normal to the target surface, the permeability in the plane of the target is decreased, and it is easier to generate the leakage magnetic field through the thickness of the target. If it were possible to decrease the fcc phase in the cobalt sputter target manufactured by the conventional process, and to increase its hcp phase so that the ratio of the fcc phase to the hcp phase is decreased, then the permeability in the plane of the target could be decreased, resulting in an increase in the magnetic leakage field on the surface of the target. This means that a high purity cobalt target which is thicker than the conventional cobalt can be used, resulting in longer service life and improved material utilization.

It is difficult in practice to obtain the ratio of fcc phase to hcp phase of cobalt by optical volume measurement. It has become common in the industry to consider a ratio of the intensity of X-ray diffraction peaks which are proportional to the volumetric ratio of the two phases. The peaks which are used in the ratio are the (200) in the fcc phase and the (10 $\bar{1}$1) peak in the hcp phase. These peaks were chosen because of overlap in the stronger fcc (111) and hcp (0002) diffraction peaks.

The inventors have developed a process for manufacturing high purity cobalt sputter targets which is characterized by a ratio of the X-ray diffraction peak intensity for the fcc phase to the X-ray diffraction peak intensity for the hcp phase, which is considerably smaller than in the conventionally processed high purity cobalt sputter target. The process of this invention comprises the steps of heating conventional high purity cobalt material having a fcc single phase until it is melted, and then pouring it into a mold and allowing it to cool from the high temperature. This step can be carried out by any available melting means. However, it is preferable to use a vacuum casting method, such as a vacuum induction melting furnace, or an e-beam furnace. The resultant cast ingot is then cooled to room temperature. In the alternative, the ingot is subjected to a hot-working treatment. The ingot is then allowed to cool to room temperature, so that part of the fcc single phase is transformed into a martensite structure comprising a hcp phase. Then, in the second stage of the process of this invention, the resultant cobalt material comprising mostly a fcc phase with some hcp phase is subjected to a cold-working treatment, which preferably results in a thickness reduction of no less than 5% at a temperature less than the hcp transformation temperature (422° C.). As a result of the cold working, a compression strain is imparted to the cobalt material and a part of the existing fcc phase is transformed into a martensite structure comprising a hcp phase.

Any of the conventional cold-rolling methods, such as rolling, drawing, swaging, forging or general press working may be used for this invention. It is preferable that the high purity cobalt is cold worked until its reduction in thickness is about 10% or more. To increase the reduction, the inventors found that intermediate anneals in the temperature range 300–422° C. for several hours allowed substantially more (40–60%) cold work to be imparted into the cobalt. Without such intermediate anneals, the cold ductility limit was found to be 20–25%. High purity cobalt manufactured in the aforementioned way can produce a significantly smaller X-ray diffraction peak intensity ratio, $I_{fcc}$ (200)/$I_{hcp}$ (10 $\bar{1}$1), compared to conventionally processed high purity cobalt. The inventors observed that in high purity cobalt which has received about 10% or greater cold deformation, there was no detectable fcc phase present in the material, in which case the intensity ratio, $I_{fcc}$ (200)/$I_{hcp}$ (10 $\bar{1}$1), becomes about zero.

Figure 3:
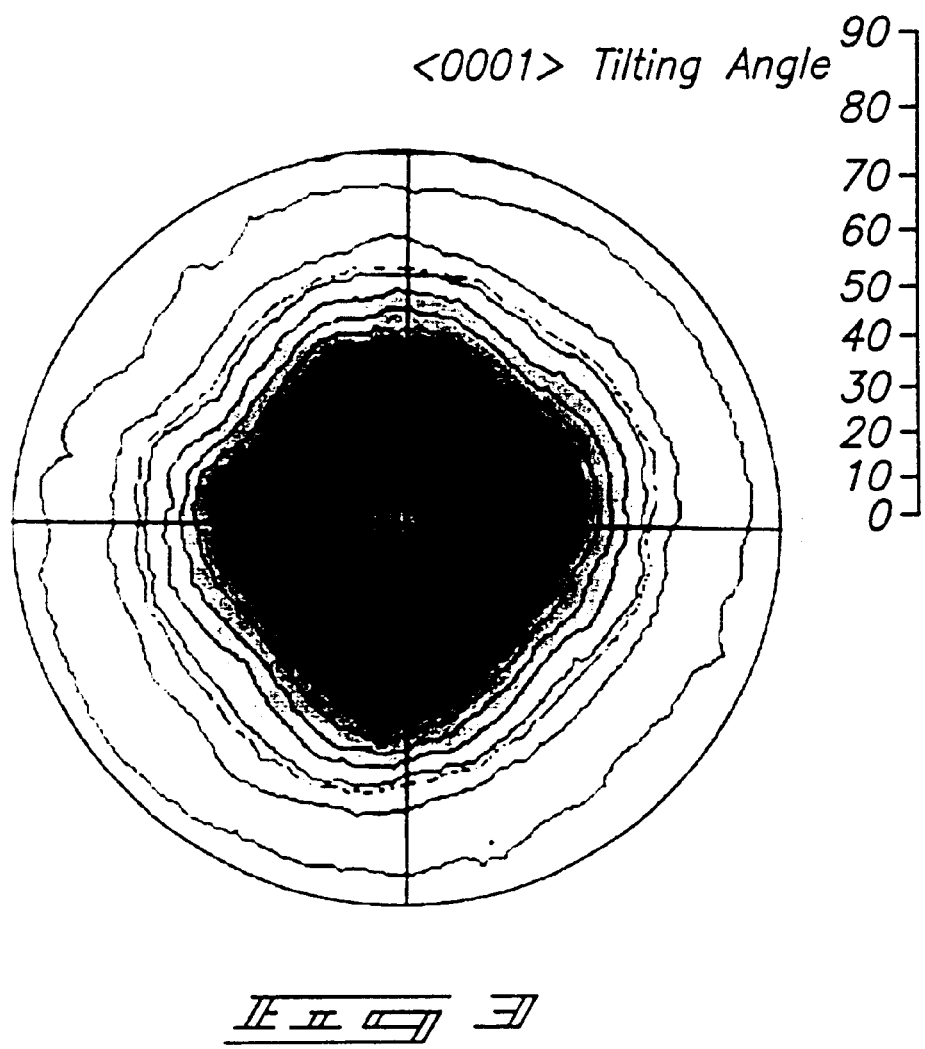
FIG. 3 is a graph of a (0002) pole figure showing 20–400° tilting of the <0001> hcp prism axis.

The two crystal phases of cobalt are anisotropic in magnetic properties and have preferred directions for magnetization (1), FIG. 1. When the hcp prism axis <0001> is tilted between 0–45° from the target normal via the deformation mechanisms described above, the result is a target with high PTF and better sputtering performance. FIG. 2 shows a graph of a (0002) pole figure with the hcp prism axis <0001> tilted between 0–10° and FIG. 3 shows a (0002) pole figure with the hcp prism axis tilted between 20–40°.

Sample 1 was conventionally processed by heating cobalt powder until it was melted. The molten cobalt was poured into a mold and allowed to cool to room temperature. An alternative conventional process would involve hot working the solidified ingot while it is still hot, by pressing or rolling the ingot into slab or sheet before allowing it to cool to room temperature. In this example the ingot was first allowed to cool to room temperature and then hot worked in the temperature range 750–900° C. to form the sample. Hot working material above 500° C. will produce the same metallurgy. According to this invention, samples 2, 3, 4, 5 and 6 were first conventionally processed, but then had an additional cold working treatment. Samples 2, 3, 4, 5 and 6 were hot-worked at a temperature >750° C. and then cold worked in the temperature range 300–422° C. Each sample had a different amount of cold work, as shown in Table 2. Sample 7 did not receive any hot-working treatment. This material was cooled to room temperature from the molten state and cold worked 49%. In samples 4, 5, 6 and 7 where the percentage cold work exceeded 20%, intermediate anneals in the range 300–422° C. were used to stress relieve and recrystallize the cobalt and allow additional cold working treatments to proceed without material exceeding the ductility limit and fracturing. This intermediate annealing step is an integral part of the invention and allows substantial quantities of cold work to be imparted into the metal, and in so doing significantly reduces the amount of fcc cobalt in the final material. Table 1 shows the composition of the seven high purity cobalt samples used to illustrate the invention.

TABLE 1

Composition of High Purity Cobalt Samples Composition (ppm)

| Sample No. | O | Ni | Fe | Al | Cr | Na | K |
|---|---|---|---|---|---|---|---|
| 1 | 24 | 110 | 10 | 19 | 0.44 | 0.34 | <0.01 |
| 2, 3 | 43 | 135 | 26 | 7.7 | 0.73 | 0.06 | <0.01 |
| 4 | 29 | 110 | 12 | 20 | 0.47 | 0.41 | <0.01 |
| 5 | 14 | 1.5 | 16 | 6.4 | 0.30 | <0.005 | <0.01 |
| 6 | 52 | 165 | 20 | 0.19 | 0.28 | 0.29 | <0.01 |
| 7 | 42 | 165 | 29 | 1.1 | 0.47 | 0.07 | <0.01 |

The intensity ratio, $I_{fcc}$ (200)/$I_{hcp}$ (10 $\bar{1}$1), of each sample was measured using CuKα radiation. The results of the testing are shown in Table 2. The data shows that the conventionally processed sample (sample 1) has an intensity ratio, $I_{fcc}$ (200)/$I_{hcp}$ (10 $\bar{1}$1), of 0.52 compared to lower values for the samples processed according to this invention (samples 2–7). In samples 4, 5, 6 and 7 there was no fcc phase detected thus producing a ratio equal to about zero. The permeability and coercivity of each sample was derived from standard B-H loop measurements. These measurements were made in two directions, parallel to the sample surface (x-direction), and normal to the sample surface (z-direction). A z/x ratio of these measurements is used to illustrate the strength and direction of the magnetic anisotropy. This value, z/x, is defined as the permeability ratio.

Magnetic flux effectively takes the path of least resistance, which in most cases is in the direction of highest permeability. In a target it is important that the direction of highest permeability approaches the target normal direction, resulting in a permeability ratio greater than 1. Values significantly greater than 1, and particularly greater than 10, are desirable because of demagnetization effects arising from the target geometrical aspect ratio. This planar shape plays a major role in limiting the amount of magnetic flux leakage into the plasma discharge space and keeping the magnetic flux within the plane of the target. The strength of the magnetic field leaked into the discharge space can be measured by PTF. FIG. 4 shows the PTF measurements associated with a conventional cobalt sputtering target (a) and a cobalt sputtering target according to this invention (b).

The results, shown in Table 2, confirmed that the permeability in the plane of the conventional sample is multiples higher than it is in the samples of this invention. The permeability ratio, (z-direction/x-direction) is significantly increased with cold work treatment according to this invention.

TABLE 2

Results of Testing on Various Samples

| Sample Number | Hot Work (%) | Cold Work (%) | Process Type | $I_{fcc}(200)/I_{hcp}(10\bar{1}1)$ | hcp (0002) tilt angle | Permeability $(dB/dH)_{max}$ | Permeability Ratio (z/x) | Coercivity $H_c$ (Oe) |
|---|---|---|---|---|---|---|---|---|
| 1 | 85 | 0 | Conventional product | 0.52 | — | 161 x-dir<br>165 z-dir | 1.02 | 19 x-dir<br>23 z-dir |
| 2 | 64 | 12 | This invention | 0.38 | — | 10.1 x-dir<br>100.4 z-dir | 9.94 | 88.5 x-dir<br>29 z-dir |
| 3 | 59 | 16 | This invention | 0.17 | — | 12.3 x-dir<br>41 z-dir | 3.33 | 144 x-dir<br>71 z-dir |
| 4 | 77 | 38 | This invention | 0 | 25–45 | 17 x-dir<br>91 z-dir | 5.35 | 136 x-dir<br>91 z-dir |
| 5 | 70 | 33 | This invention | 0 | 20–40 | 16 x-dir<br>230 z-dir | 14.37 | 122 x-dir<br>50 z-dir |
| 6 | 87 | 44 | This invention | 0 | 0–10 | 7 x-dir<br>448 z-dir | 64.00 | 96 x-dir<br>25 z-dir |
| 7 | 0 | 49 | This invention | 0 | 8–12 | 6.8 x-dir<br>161 z-dir | 23.67 | 111 x-dir<br>50 z-dir |

% hot and cold work is calculated from the initial material thickness before the working stage and is not calculated

We claim:

1. A cobalt sputtering target comprising a Ni content not more than about 200 ppm, a Cr content of not more than about 50 ppm, and an X-ray diffraction peak intensity ratio $I_{fcc}(200)/I_{hcp}(10\ 11)$ of the cobalt in said target of less than about 0.5.

2. The sputtering target of claim 1 wherein most of the hexagonal prism axis <0001> is tilted between about 0–20° from a normal of the target.

3. The sputtering target of claim 1 wherein most of the hexagonal prism axis <0001> is tilted between about 20–45° from a normal of the target.

4. The sputtering target of claim 1 wherein the X-ray diffraction peak intensity ratio $I_{fcc}(200)/I_{hcp}(10\ 11)$ of the cobalt is 0.

5. The sputtering target of claim 4 wherein most of the hexagonal prism axis <0001> is tilted between about 0–20° from a normal of the target.

6. The sputtering target of claim 4 wherein most of the hexagonal prism axis <0001> is tilted between about 20–45° from a normal of the target.

7. A method of manufacturing a cobalt sputtering target, comprising:
   a) preparing a cobalt ingot having a Ni content of not more than about 200 ppm, and a Cr content of not more than about 50 ppm;
   b) subjecting said cobalt ingot to hot working at a temperature higher than an hcp transformation temperature of the cobalt of the ingot; and
   c) subjecting the hot worked cobalt ingot to cold working with a thickness reduction of no less than about 5%; the cold working being at a temperature lower than the hcp transformation temperature of the cobalt of the ingot.

8. The method of claim 7 wherein the preparation of the cobalt ingot includes one or both of vacuum casting and e-beam melting.

9. The method of claim 7 wherein the hot working comprises a temperature of from about 750° C. to about 900° C., and wherein the cold working comprises a temperature of from about 300° C. to about 422° C.

10. The method of claim 7 comprising:

more than one cold working step at temperatures lower than the hcp transformation temperature of cobalt; and intermediate annealing between the cold working steps, the intermediate annealing being at a temperature below the hcp transformation temperature of cobalt.

* * * * *

UNITED STATES PATENT AND TRADEMARK OFFICE
CERTIFICATE OF CORRECTION

PATENT NO. : 6,585,866 B2
DATED : July 1, 2003
INVENTOR(S) : Robert S. Cole et al.

It is certified that error appears in the above-identified patent and that said Letters Patent is hereby corrected as shown below:

<u>Column 2,</u>
Line 15, replace "poured into a mold. At this temperature the material it is in" with
-- poured into a mold. At this temperature the material is in --
Line 33, replace "FIG. 3 is a graph of a (0002) pole figure showing 20-400º" with
-- FIG. 3 is a graph of a (0002) pole figure showing 20-40º --
Line 46, replace "a target consisting mostly fcc phase has very low PTF, and"
with -- a target consisting mostly of fcc phase has very low PTF, and --

Signed and Sealed this

Twenty-first Day of October, 2003

JAMES E. ROGAN
*Director of the United States Patent and Trademark Office*